United States Patent
Behfar et al.

(10) Patent No.: US 7,606,277 B2
(45) Date of Patent: Oct. 20, 2009

(54) ETCHED-FACET RIDGE LASERS WITH ETCH-STOP

(75) Inventors: Alex A. Behfar, Ithaca, NY (US); Cristian B. Stagarescu, Ithaca, NY (US); Alfred T. Schremer, Ithaca, NY (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 11/644,828

(22) Filed: Dec. 26, 2006

(65) Prior Publication Data

US 2008/0151955 A1 Jun. 26, 2008

(51) Int. Cl.
  *H01S 5/00* (2006.01)
(52) U.S. Cl. .................. 372/43.01; 372/45.01
(58) Field of Classification Search .......... 372/43.01, 372/45.01
  See application file for complete search history.

(56) References Cited

U.S. PATENT DOCUMENTS

| 4,851,368 | A |   | 7/1989 | Behfar-Rad |
| 5,208,878 | A | * | 5/1993 | Thulke ................. 385/14 |
| 5,309,465 | A | * | 5/1994 | Antreasyan et al. ...... 372/43.01 |
| 6,406,932 | B2 |  | 6/2002 | Lee et al. |
| 6,914,923 | B2 |  | 7/2005 | Yoshitake et al. |
| 6,958,493 | B2 |  | 10/2005 | Hasegawa et al. |
| 2004/0105476 | A1 |  | 6/2004 | Wasserbauer |
| 2005/0083982 | A1 |  | 4/2005 | Behfar |
| 2006/0018352 | A1 | * | 1/2006 | Song et al. .............. 372/46.01 |
| 2006/0187985 | A1 |  | 8/2006 | Behfar |

OTHER PUBLICATIONS

Behfar-Rad et al, "Monolithic AlGaAs-GaAs Single Quantum-Well Ridge Lasers Fabricated with Dry-Etched Facets and Ridges", IEEE Journal of Quantum Electronics, May 1992, pp. 1227-1231, vol. 28.

* cited by examiner

*Primary Examiner*—Dung T Nguyen
(74) *Attorney, Agent, or Firm*—Jones, Tullar & Cooper, P.C.

(57) ABSTRACT

A photonic device incorporate an epitaxial structure having an active region, and which includes a wet etch stop layer above, but close to, the active region. An etched-facet ridge laser is fabricated on the epitaxial structure by dry etching followed by wet etching. The dry etch is designed to stop before reading the depth needed to form the ridge. The wet etch completes the formation of the ridge and stops at the wet etch stop layer.

18 Claims, 8 Drawing Sheets

ETCHED-FACET RIDGE LASERS WITH ETCH-STOP

FIELD OF THE INVENTION

The present invention relates, in general, to etched-facet photonic devices, and more particularly to improved etched-facet ridge laser devices of the type disclosed in copending U.S. application Ser. No. 11/356,203, filed on Feb. 17, 2006 and entitled "High Reliability Etched Facet Photonic Devices" and assigned to the assignee of the present application, and to a process for fabricating such devices.

BACKGROUND OF THE INVENTION

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxy structure having an active layer parallel to the substrate surface. The wafer is then processed with a variety of semiconductor processing tools to produce a laser optical cavity incorporating the active layer and incorporating metallic contacts attached to the semiconductor material. Laser mirror facets typically are formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. For most semiconductor devices, however, the foregoing cleaving process is imprecise, for it relies on the location and angle of the crystalline planes of the semiconductor material. With some materials, for example, there may be cleave planes of approximately equal strength that are oriented at such acute angles to one another that minute perturbations occurring during cleaving can redirect a fracture interface from one cleave plane to another. Furthermore, the cleaving process creates fragile bars and miniscule chips that are awkward to handle during testing. In addition, mechanical cleaving tends to be incompatible with later processing of the individual chips, as would be needed to provide a monolithic integration of components on a chip, for example, since the wafer must physically be broken to obtain fully functional lasers, and once the wafer has been cleaved it typically is in small pieces so that conventional lithographical techniques cannot readily be used to further process the lasers.

The foregoing and other difficulties resulting from the use of cleaved facets led to the development of a process for forming the mirror facets of semiconductor lasers through etching. This process, which is described in U.S. Pat. No. 4,851,368, for example, also allows lasers to be monolithically integrated with other photonic devices on the same substrate. The process described in this patent was extended to provide a process for fabricating ridge lasers having etched facets, as disclosed in "Monolithic AlGaAs—GaAs Single Quantum-Well Ridge Lasers Fabricated with Dry-Etched Facets and Ridges", A. Behfar-Rad and S. S. Wong, IEEE Journal of Quantum Electronics, volume 28, No. 5, pages 1227-1231, May 1992, and further described in the above-mentioned U.S. patent application Ser. No. 11/356,203. However, it has been found that the depth of the ridge in such devices, and its consequent location with respect to the active region in the laser structure, must be precise if consistent results are to be obtained in the fabrication process, and controlling the dry etch process sufficiently to produce consistent ridge depths is very difficult.

Because controlling the ridge etch depth in a dry etch is difficult, etched facet ridge laser devices produced by prior processes have been found to have low single lateral mode yields and wide distributions in threshold current. In order to obtain as much as a 30-40% yield of usable devices with these processes it has been necessary to use a multiple-step etch procedure to prevent the ridge etch from extending too deeply into the epitaxial structure. This requires that the dry etch be repeated three or four times and the ridge etch depth measured after each etch in order to obtain the proper dimensions, and this effort is time consuming and significantly increases the cost of these devices.

SUMMARY OF THE INVENTION

Since high uniformity and yield for etched facet ridge devices is extremely desirable, an improved process for fabricating an etched-facet ridge laser device is provided in accordance with the present invention. In this process, a ridge laser having etched facets is formed in an epitaxial structure that incorporates a wet etch stop layer at the location where the base of the ridge is to be located. The ridge is partially formed using a prior art lithography and dry etch process, but the dry etch is stopped short of the ridge base. Lithography defines a wet etch window that overlaps the partially etched ridge while keeping its end sections and its end facets protected by a resist layer. Then the structure is wet-etched to complete the formation of the ridge and to remove residual material from above the etch stop layer. The stop layer in the epitaxial structure precisely and reliably stops the wet etch at the depth desired for the base of the ridge structure, increasing the yield of the fabrication process to about 98-99.8%.

Briefly, in accordance with the invention, a substrate, or wafer, is formed, for example from a type III-V type compound or an alloy thereof, which may be suitably doped. A succession of layers is deposited on a top surface of the substrate, as by an epitaxial deposition process such as Metalorganic Chemical Vapor Deposition (MOCVD) or Molecular Beam Epitaxy (MBE). These layers, which form an optical waveguide in the transverse direction, typically include an active region which may be formed with AlInGaAs-based quantum wells and barriers and adjacent upper and lower cladding regions. In one example, the semiconductor laser photonic device structure layers may be epitaxially formed on an InP substrate, with the upper and lower cladding regions being formed from a semiconductor material such as InP which has a lower index than the index of the active region. An InGaAs cap layer is provided on the top surface of the upper cladding layer to allow ohmic contacts.

In accordance with the present invention, a wet etch stop layer is epitaxially deposited on the substrate at the level of the base of the ridge that is to be formed in the structure. Thus, for example, a stop layer of Gallium Indium Arsenide Phosphide (GaInAsP) is deposited in the cap layer, just above the upper cladding layer. This stop layer is about 20 nm thick, and is lattice matched with the InP cladding layer. The resulting wafer is processed using standard photolithography and chemically assisted ion beam etching (CAIBE) dry etching steps to form one or more laser cavities and facets. Thereafter, a second photolithography step is used to define one or more ridges on the previously formed cavities, and CAIBE is used to etch the ridges. Since the CAIBE process is hard to control with precision, and thus is not very accurate, this dry etch step is designed to be incomplete; i.e., it is designed to end short of the desired depth of the ridge and before it reaches the stop layer. Thereafter, another photolithography step is performed to cover the end sections of the ridge and the facets with a protective resist layer and a wet etch step, using a selective wet etchant, is performed. The selective wet etchant, for example a mixture of HCl and $H_3PO_4$, removes the residual upper cladding material and stops on or etches only very slowly, the etch stop layer. Thus, the wet etch completes the ridge formation and stops at the stop layer. Although it etches laterally a small amount at the bottom of the ridge, this is easily accounted for, and the process serves to form a ridge having precisely the desired dimensions. This wet etch also removes any residual artifacts left by the dry etch step, and produces a ridge structure having a high degree of precision, resulting in a high device yield.

Although the foregoing example is based on providing a photonic device consisting of a laser device on an InP substrate, it will be understood that etched features for other photonic devices with active regions can be fabricated using a combination of dry and wet etching, with a wet etch stop layer defining the limit of the etch step, and that these devices can be formed on other substrates. Examples of such photonic devices are electroabsorption modulators and semiconductor optical amplifiers. Conventional ridge lasers that have their facets formed by cleaving are compatible with the use of an etch stop layer.

BRIEF DESCRIPTION OF DRAWINGS

The foregoing, and additional objects, features and advantages of the present invention will be apparent to those of skill in the art from the following detailed description of preferred embodiments thereof, taken with the accompanying drawings, in which.

DETAILED DESCRIPTION OF PREFERRED EMBODIMENTS

Figure 1:
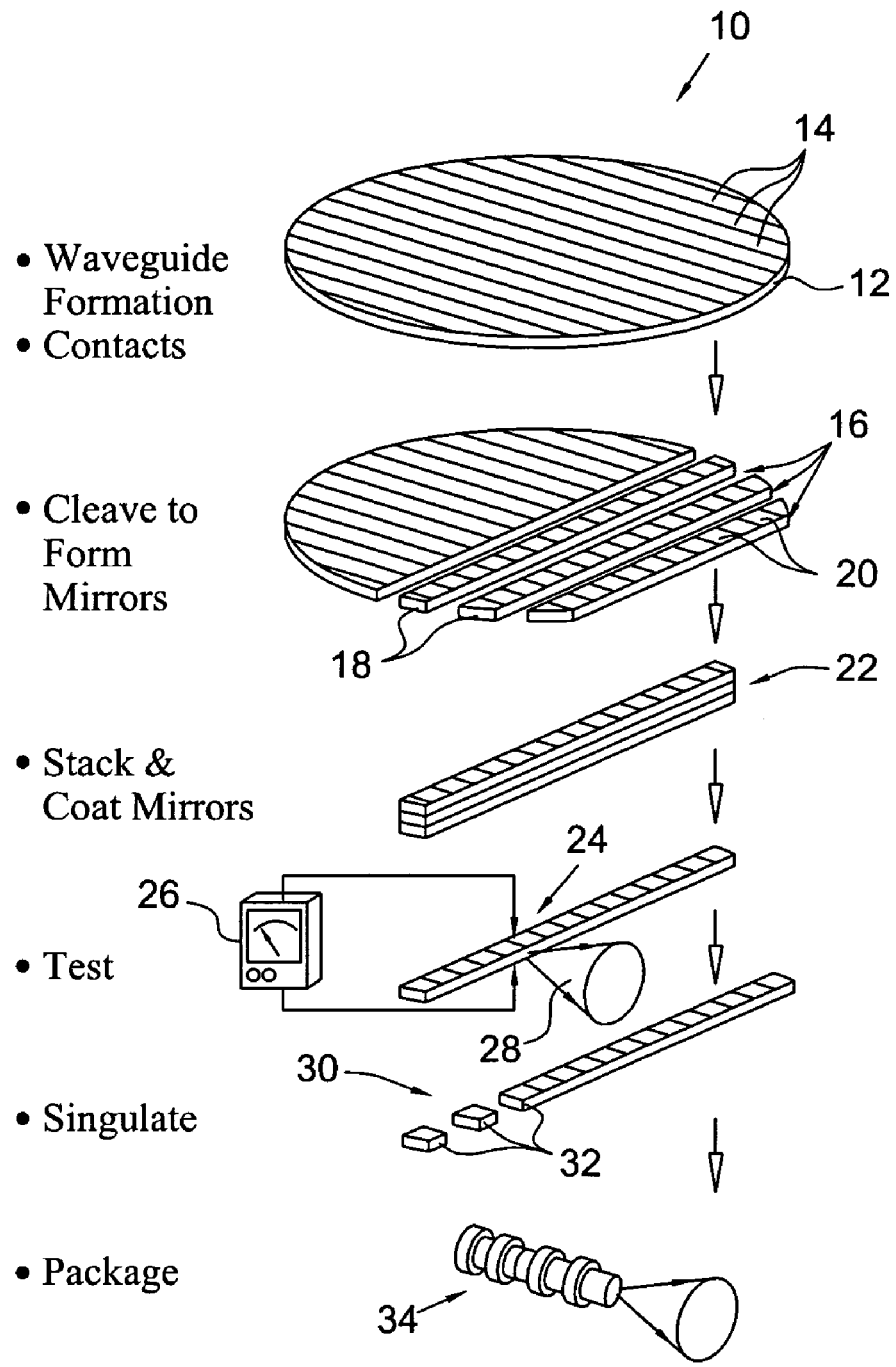
FIG. 1 illustrates a prior art cleaved facet process for fabricating multiple photonic devices such as lasers on a wafer.

As generally illustrated at 10 in FIG. 1, mechanical cleaving of a semiconductor epi wafer 12 is the usual process for defining reflective mirrors, or facets, at the cavity ends of edge-emitting diode lasers, fabricated on the wafer. In this process, multiple waveguides 14 are fabricated on the wafer substrate, a metal contact layer is applied, and the wafer is mechanically cleaved, as along cleave lines 16, to form bars 18 of laser devices 20. The bars 18 are then stacked, as illustrated at 22, and the cleaved end facets of the laser devices are coated to provide the desired reflection and emission characteristics. The individual laser devices 20 may then be tested, as at 24, by applying a bias voltage 26 across the individual lasers and detecting the resulting output light beam 28. The bars of laser devices may then be separated, or singulated, as at 30, to produce individual chips 32 each containing one or more laser devices that may be suitably packaged, in known manner, as at 34.

As discussed above, for most semiconductor devices the foregoing cleaving process is imprecise, for it relies on the location and angle of the crystalline planes of the semiconductor material to locate the laser facets on the waveguides. With some materials, for example, there may be cleave planes of approximately equal strength that are oriented at such acute angles to one another that minute perturbations occurring during cleaving can redirect a fracture interface from one cleave plane to another, causing the facet to be located at the wrong place or at the wrong angle, making the laser inoperative. Furthermore, the cleaving process illustrated in FIG. 1 creates fragile bars 18 that are awkward to handle during mirror coating and testing. In addition, mechanical cleaving tends to be incompatible with later processing of the individual chips, such as the process steps that would be needed to provide a monolithic integration of components on a chip, for example, since the wafer must physically be broken to produce the laser facets and to obtain fully functional lasers.

Figure 2:
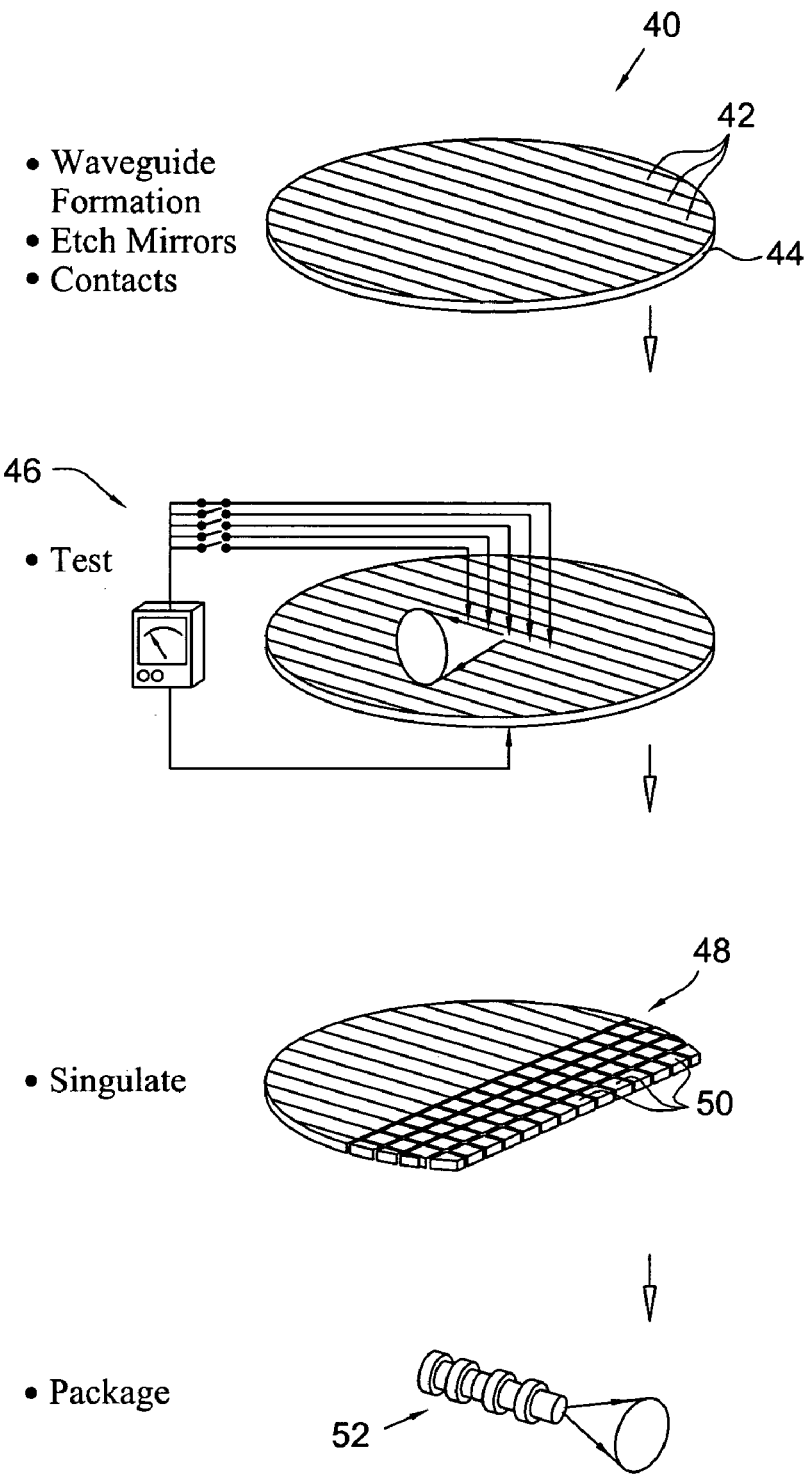
FIG. 2 illustrates a prior art etched facet process for fabricating multiple photonic devices such as lasers on a wafer.

An alternative technology for fabricating lasers is generally illustrated at 40 in FIG. 2, wherein, as a first step, multiple waveguides 42 are fabricated on a suitable wafer substrate 44. Preferably, these are parallel waveguides that extend across the wafer, as illustrated. A process based on photolithography and chemically assisted ion-beam etching (CAIBE) is then used to form facets at desired locations along the waveguides to produce individual laser waveguide cavities. These facets are precisely located, without regard to the crystalline structure of the material, and have a quality and reflectivity that is equivalent to those obtained by cleaving. Since the laser cavities and facets are fabricated on the wafer much the same way that integrated circuits are fabricated on silicon, this process allows the lasers to be monolithically integrated with other photonic devices on a single chip, and allows the devices to be tested inexpensively while still on the wafer, as illustrated at 46. Thereafter, the wafer may be singulated, as at 48, to separate the chips 50, and the chips may then be packaged, as illustrated at 52. This process has a relatively high yield and low cost, as compared to the above-described cleaving process, and allows the manufacture of lasers having cavities of various forms independently of the cleaving planes in the wafer material. The prior art fabrication process of FIG. 2 is described in greater detail in the above-referenced article in the IEEE Journal of Quantum Electronics.

Figure 3:
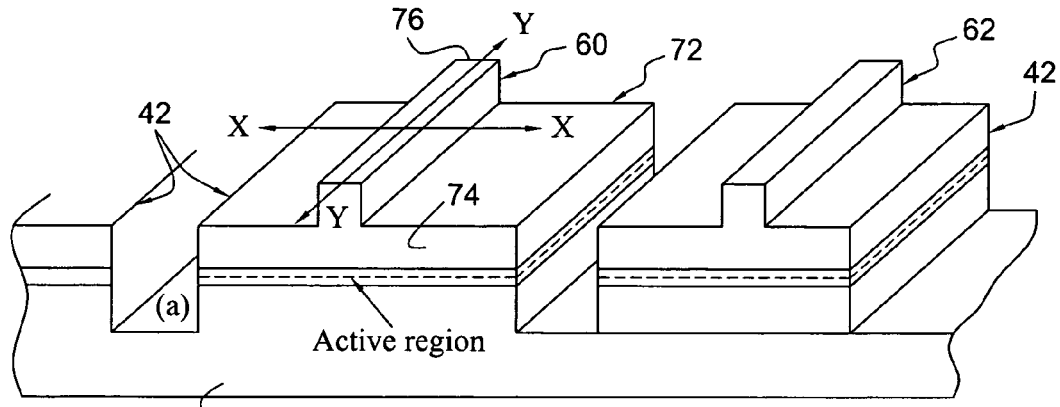
FIG. 3 illustrates in perspective partial view multiple prior art etched facet lasers on a wafer.

In the fabrication of edge-emitting versions of such etched facet ridge lasers, four photolithographic patterning steps are required, the first step producing a pattern mask which defines one or more laser bodies, each with spaced end facets. This pattern is transferred into the wafer structure by etching. Thereafter, a second lithographic step produces patterns for forming ridges on the structures, and this pattern is transferred into the structure, again by etching, using a CAIBE process. A third lithography provides contact holes, and a fourth lithography provides a pattern for p-contact metallization. The resulting edge-emitting ridge laser structures are illustrated in FIG. 3, wherein ridges 60 and 62 are formed on respective laser waveguides 42, and wherein each laser cavity, such as cavity 72, for example, is fabricated with etched end facets 74 and 76.

As noted above, the etched facet ridge laser devices produced by the foregoing procedure can have a lower than desired yield and can produce wide variations in the threshold current for establishing lasing and low single lateral mode yields. It has been found that the cause of these problems lies in variations that occur in the heights of the laser ridges during the fabrication process. The depth of each ridge etch and the consequent location of the base of the ridge with respect to the active region in the laser structure must be precise if consistent results are to be obtained in the fabrication process. However, it has been found that controlling the dry etch process sufficiently to produce consistent ridge etch depths is very difficult.

Figure 4:
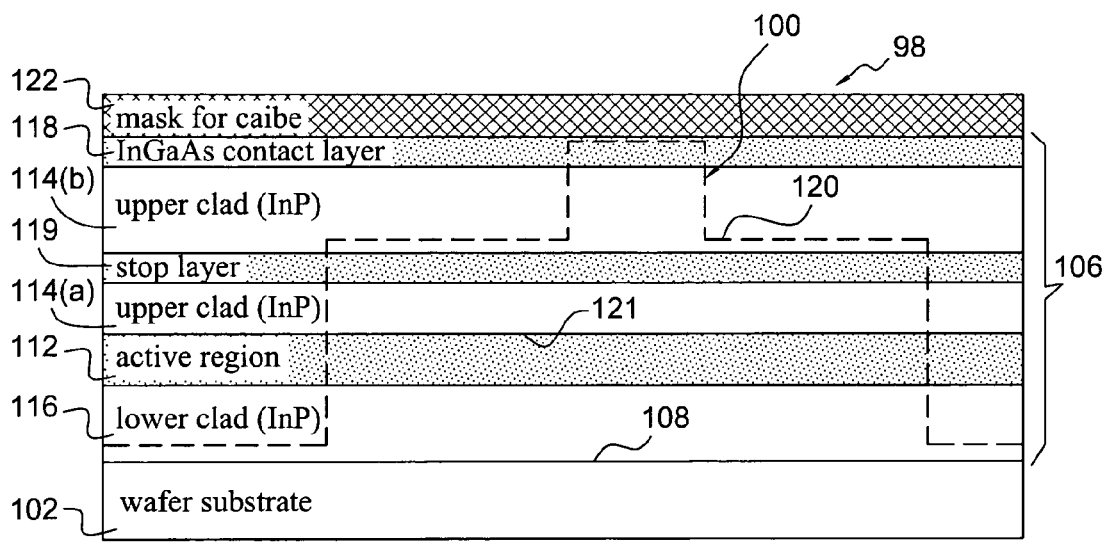
FIG. 4 illustrates in cross-section the succession of layers forming a wafer in accordance with the present invention.
Figure 5:
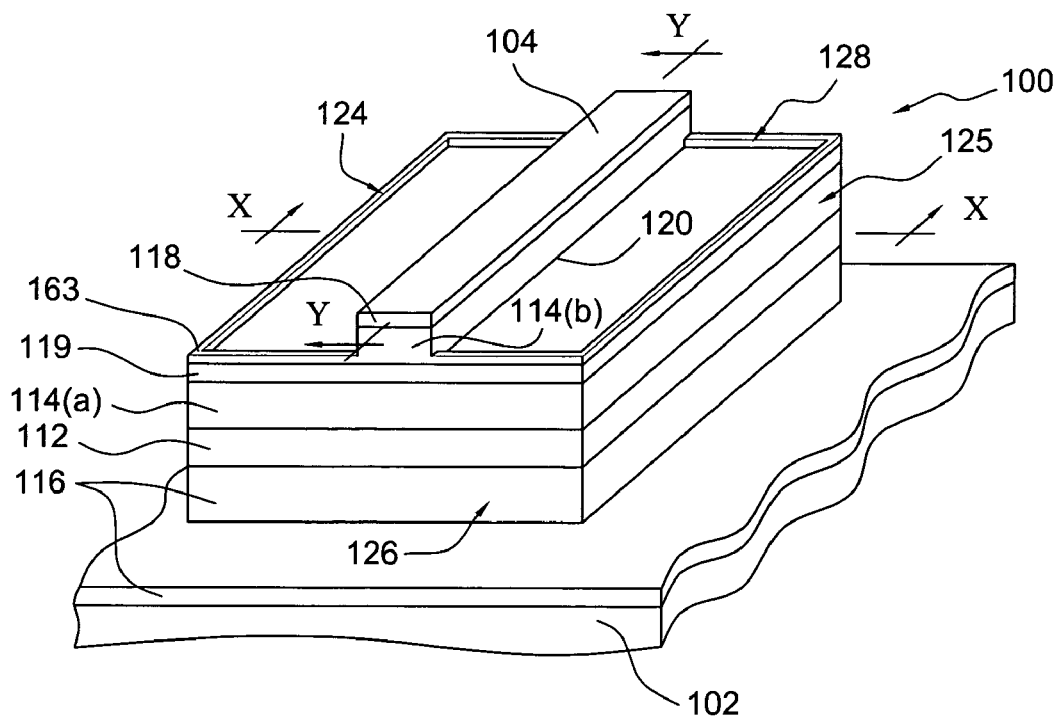
FIG. 5 illustrates in perspective view an etched facet ridge laser with an etch stop, before the application of electrical contacts, fabricated in accordance with the invention.

The foregoing problem is overcome by the present invention, as illustrated diagrammatically in FIGS. 4 and 5 by the provision of a layered wafer 98 in which a photonic device 100 is fabricated, and in FIGS. 6 (a and b) through 12 (a & b), wherein a process for fabricating the photonic device on a substrate 102 is illustrated. It will be understood that the dimensions and proportions shown in these figures are not necessarily to scale, but are used to clearly illustrate the salient features of the structure and the process. Although the invention will be described in terms of an edge-emitting ridge laser having an etched ridge 104, such as that illustrated in FIG. 5, it will be understood that other types of lasers or other photonic devices, such as the ridge horizontal cavity surface emitting laser or HCSEL described in co-pending U.S. patent application Ser. Nos. 10/958,069 and 10/963,739, may also be fabricated utilizing the etch-controlling process of this invention.

As is conventional, the wafer 98 includes a substrate 102 that is formed, for example, of a type III-V type compound, or an alloy thereof, which may be suitably doped. As illustrated in FIG. 4, a succession of layers 106 may be deposited on a top surface 108 of the substrate 102, as by an epitaxial deposition such as Metalorganic Chemical Vapor Deposition (MOCVD) or Molecular Beam Epitaxy (MBE). These layers 106 form a laser structure, or an optical waveguide, in the transverse direction that typically includes an active region 112 and upper and lower cladding regions 114 and 116.

In one example, the semiconductor laser, or other photonic device, structure layers 106 are epitaxially formed on an InP substrate 102. The upper and lower cladding regions 114 and 116, respectively, of the photonic structure are formed from a semiconductor material such as InP which has a lower index than the index of the active region 112. These cladding regions are adjacent the active region, which may be formed with AlInGaAs-based quantum wells and barriers. An InGaAs cap layer 118 is provided on top of the upper cladding layer 114 to allow ohmic contacts.

Incorporated in the cladding layer 114 is a wet etch stop layer 119 that is located at the level where the base 120 of the ridge is to be located upon completion of the fabrication process, as illustrated in FIG. 5. The stop layer 119 is an epitaxially deposited layer of GaInAsP that is approximately 20 nm thick and divides the upper cladding layer 114 into bottom and top segments 114(a) and 114(b). Stop layer 119 is spaced close to, but above, the bottom surface 121 of the upper cladding layer 114 which surface is at the same time the top surface of the active region 112.

Figure 6A:
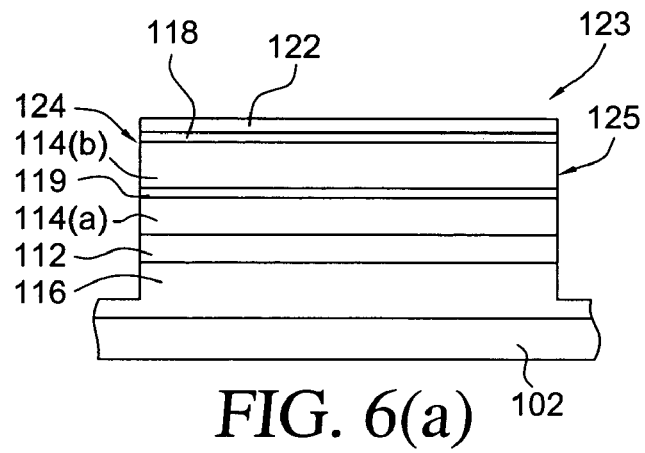
FIGS. 6 (a and b) through 12 (a and b) illustrate in x and y-direction cross-sectional views the fabrication steps for making an etched facet ridge laser with an etch stop using the wafer of FIG. 4, in accordance with the present invention.
Figure 6B:
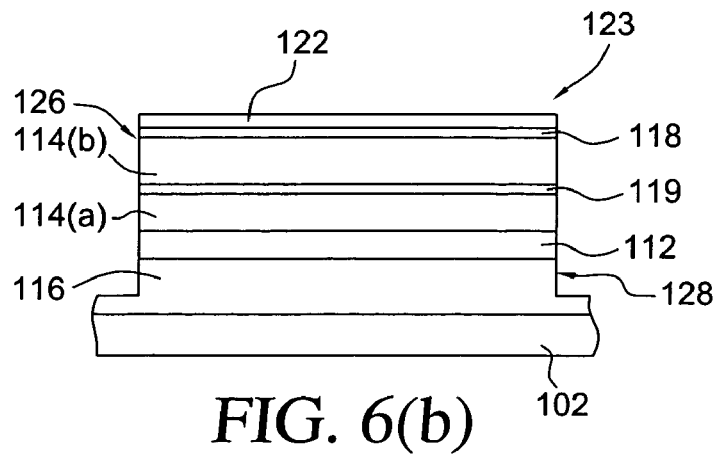

In the process of the invention, a masking layer 122, such as a 200 nm thick layer of $SiO_2$, is deposited on the epitaxially grown laser structure 106 by plasma-enhanced chemical vapor deposition (PECVD), as illustrated in FIG. 4. A first lithographic step defining, for example, at least one laser body and facets in a photoresist layer, is performed on the wafer 98, which is the equivalent of the wafer 44 illustrated in FIGS. 2 and 3, and the photoresist pattern is transferred to the underlying $SiO_2$ mask layer 122 using reactive ion etching (RIE). The photolithography steps of spinning a photoresist layer onto the mask layer 122, exposing the photoresist through a lithographic mask to produce a pattern, and thereafter transferring the pattern to the mask layer 122 are not illustrated, since they are conventional and well-known in the art. After the photoresist is removed by oxygen plasma, the $SiO_2$ pattern in layer 122 is transferred to the laser structure using chemically assisted ion beam etching (CAIBE), to form the bodies 123, illustrated in FIGS. 6(a) and 6(b), of photonic devices such as the laser waveguides generally illustrated at 42 in FIG. 3, and to form along those waveguides multiple, discrete laser cavities from which lasers such as that illustrated at 100 in FIG. 5 can be formed. The body 123 is formed with etched side walls 124 and 125 and etched end facets 126 and 128, as illustrated in FIGS. 6(a) and 6(b). In the case of a HCSEL, two separate photolithography steps and two separate CAIBE steps would be used instead of the single step shown here for the edge-emitting laser.

FIG. 6(a) is a cross-section taken in the direction of the arrows at the x-x axis of the waveguide 100 of FIG. 5, while FIG. 6(b) is a cross-section of the waveguide taken in the direction of the arrows at the y-y axis of FIG. 5.

Figure 7A:
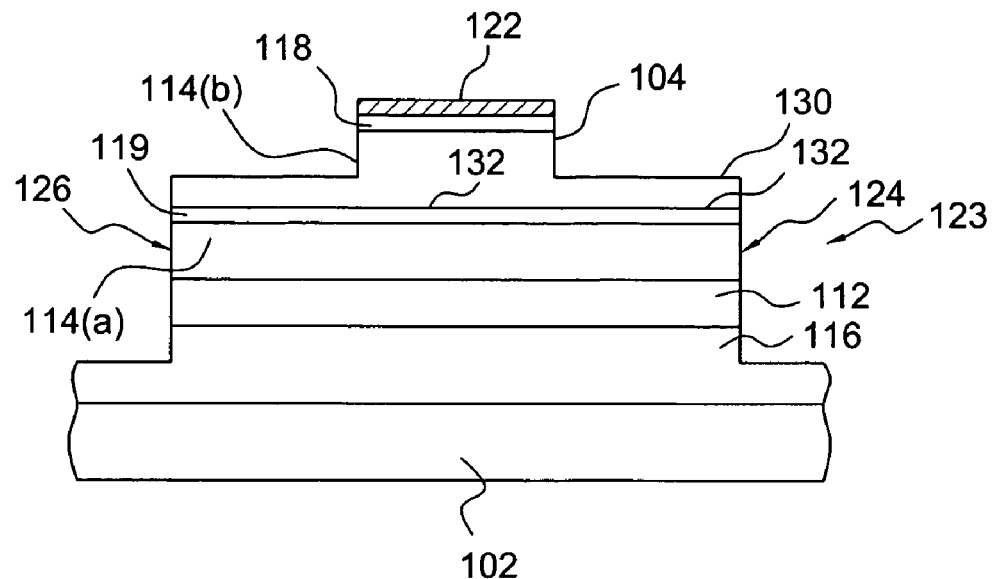
Figure 7B:
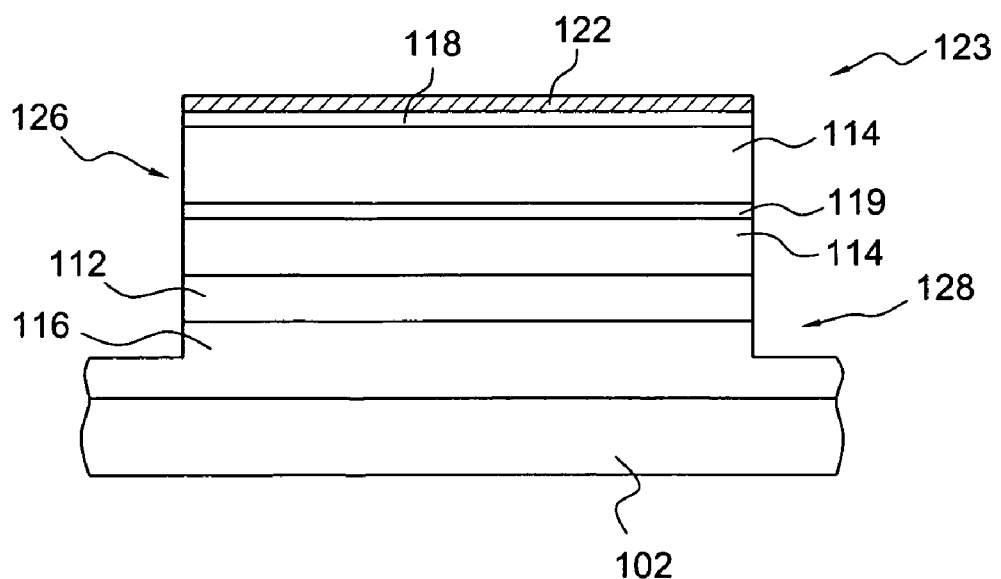

As illustrated in FIGS. 7(a) and 7(b), a second photoresist lithography to produce a pattern defining one or more ridges such as ridge 104 on the previously defined laser bodies 123 on the wafer is performed, and RIE is used to transfer the photoresist pattern to the PECVD $SiO_2$ mask layer 122. After removing the photoresist with oxygen plasma, CAIBE is used to form the ridges 104 for each laser body 123 in the laser structure as illustrated. In contrast to prior fabrication processes for ridge-type etched facet devices, this ridge CAIBE dry etch step is designed to stop short of the etch depth needed to complete the ridge 104, in order to ensure that the etch does not unintentionally continue beyond the desired depth of the ridge base 120. In addition, dry etching can also leave residual material in the form of roughness or a grass-like layer that can prevent the precise depth control necessary for achieving high yields. Accordingly, as illustrated in FIGS. 7(a) and 7(b), this etch process is designed to end at an etch floor 130 in cladding layer 114(b) which is always at or above the top surface 132 of the layer 119. This prevents the CAIBE etch from extending below the desired level of the base 120 of the ridge 104, illustrated in FIG. 5.

Figure 8A:
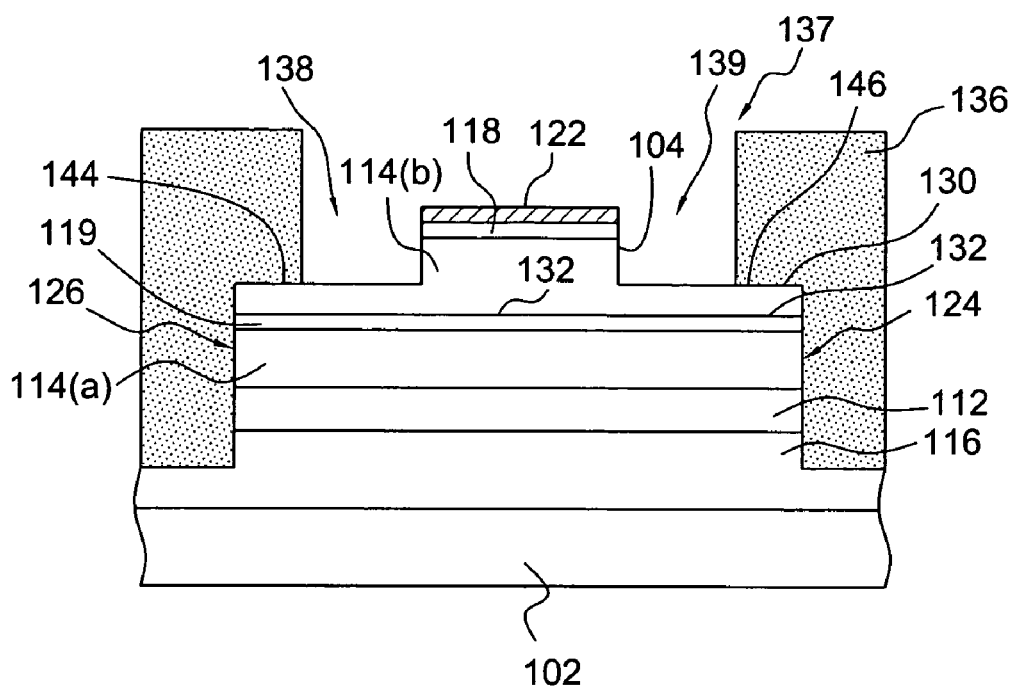
Figure 8B:
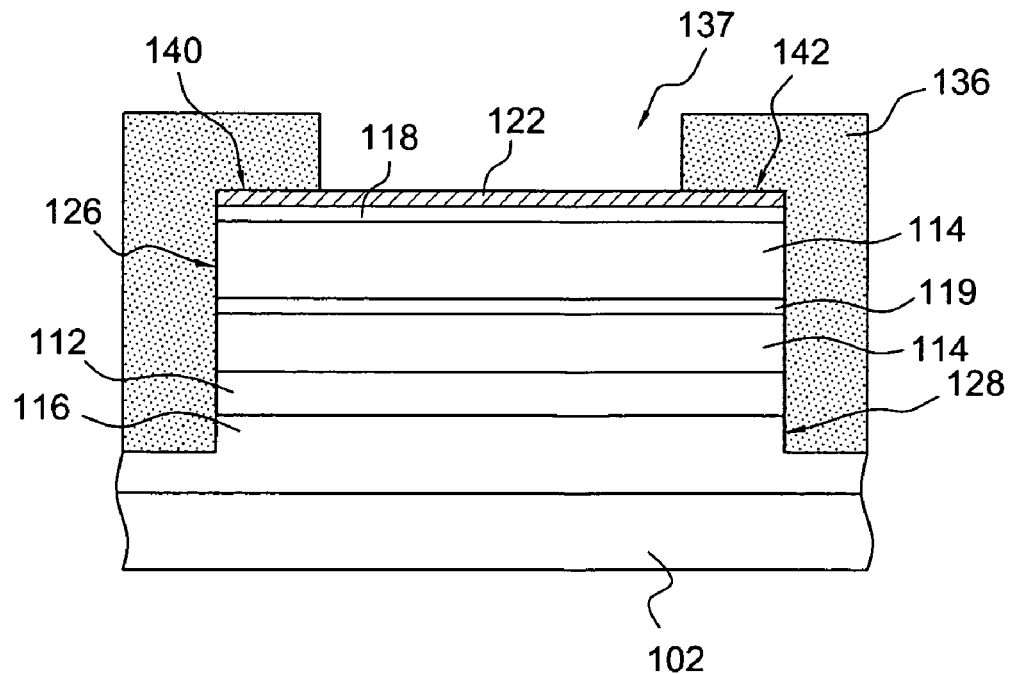

As illustrated in FIGS. 8(a) and 8(b), to complete the ridge structure, the top surface of the device is covered with a masking layer 136 of photoresist that is then patterned photolithographically to expose, after development, a wet etch window 137 that includes the ridge 104 as well as regions 138 and 139 on each side of and along the length of the ridge 104. The photoresist masking layer 136 extends over the ends 140 and 142 of the ridge and over the end facets 126 and 128 to protect them from the following wet etch, and preferably also overlaps the outer edges 144 and 146 of the etch floor 130 by a small amount to accommodate lateral etching by the wet etch step.

Figure 9A:
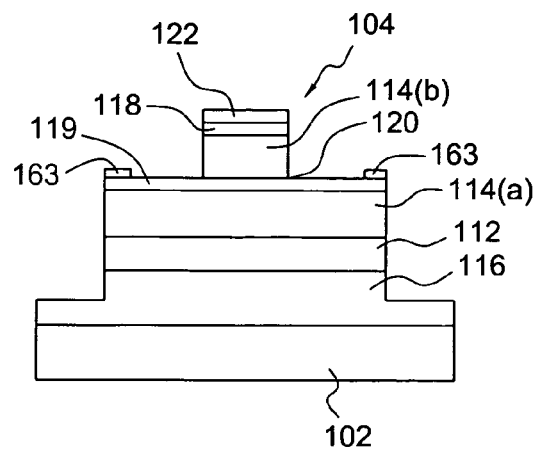
Figure 9B:
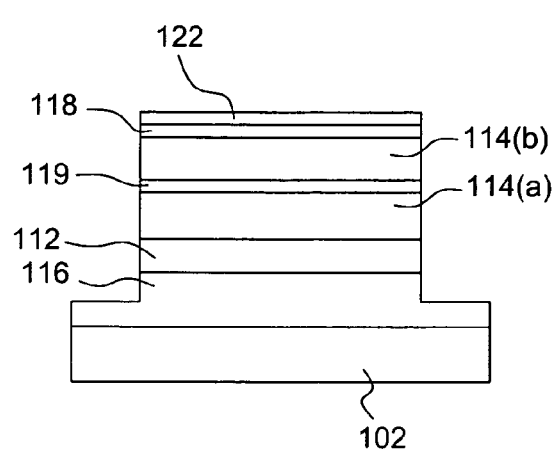

The wet etch window 137 is exposed to a selective wet etchant, for example a mixture of HCl and $H_3PO_4$, to remove the residual upper cladding material above layer 119. The wet etch stops or effectively stops at the top surface 132 of the stop layer 119, which is the desired location of the base 120 of the ridge, and leaves the ridge at its desired height, and oxygen plasma is then used to remove the photoresist mask 136, as illustrated in FIGS. 9(a) and 9(b). Any roughness or grass-like features that may be present are eliminated by the wet etch process, allowing precise depth control.

Although a single laser cavity with a single ridge 104 is illustrated in FIGS. 5-12 (a) and (b), it will be understood that multiple photonic devices preferably are fabricated on a single wafer. As illustrated, for example, in FIG. 2, multiple spaced-apart waveguides 42, each of which may incorporate a number of ridge lasers, usually are fabricated on a single wafer, and after completion of the remaining process steps described below, they are separated for packaging by singulation, or dicing, as discussed above, to produce individual photonic devices.

Figure 10A:
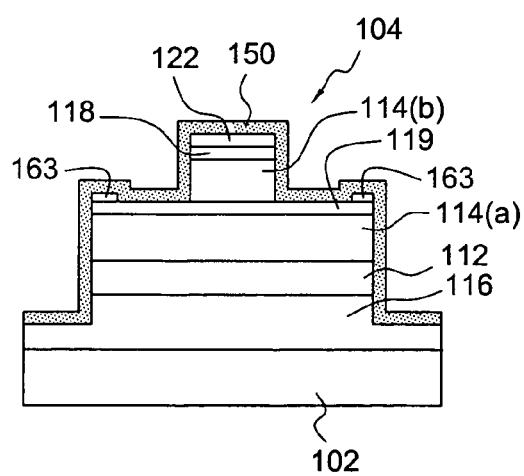
Figure 10B:
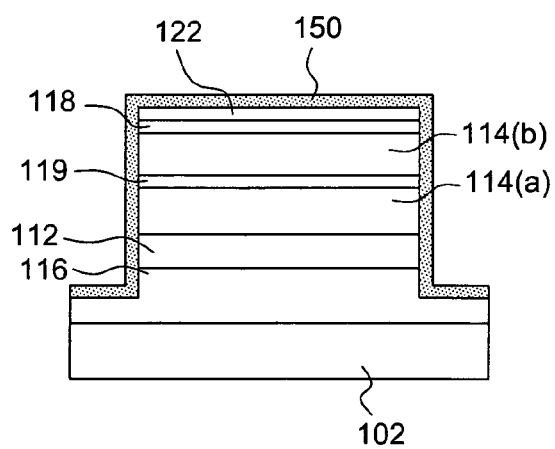
Figure 11A:
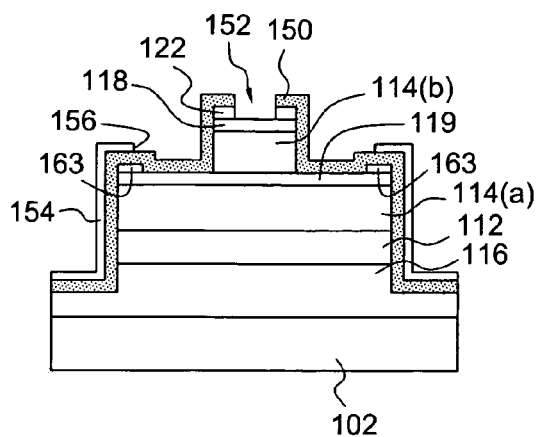
Figure 11B:
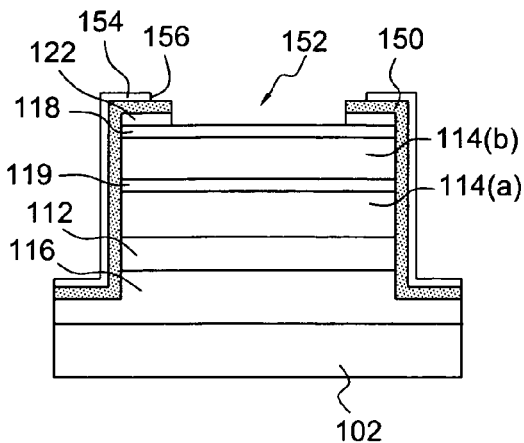
Figure 12A:
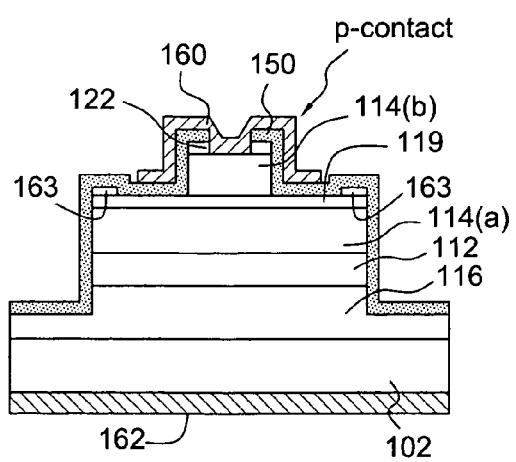
Figure 12B:
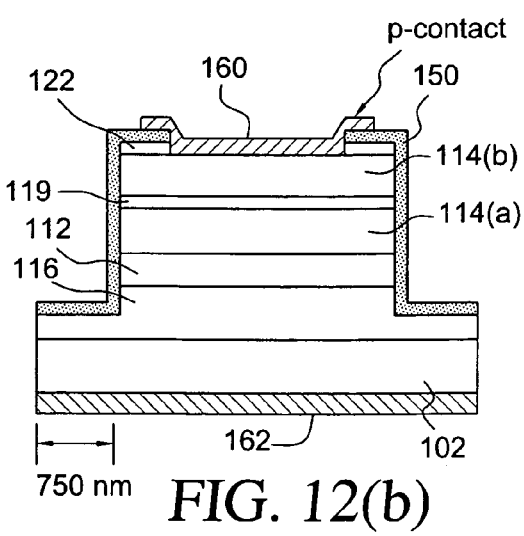

After formation of the laser bodies, facets and ridges, as described above with respect to FIGS. 5 and 6 (a) and (b)-9 (a) and (b), and before the singulation step of FIG. 2, a 120 nm thick passivation layer 150 of a dielectric material such as SiO₂ is deposited, using PECVD, to cover the entire wafer, including the photonic devices, as illustrated in FIGS. 10(a) and 10(b) for a single ridge 104. Thereafter, as illustrated in FIGS. 11(a) and 11(b), a third lithography for defining a p-contact opening in a photoresist mask layer on the photonic structure is performed and RIE through the mask is used to open a contact window 152 in the SiO₂ layers 150 and 122. Oxygen plasma is then used to remove the photoresist.

A fourth lithography is performed to define a metallization lift-off pattern for a p-contact, in a photoresist mask layer, wherein the lift-off structure 154 is lithographically defined to produce a contact opening 156 surrounding the contact window 152. The under-cut that a typical lift-off structure possesses has not been shown explicitly in the metallization lift-off pattern 154, but it will be understood that this is present. A p-contact metal 160 (FIGS. 12(a) and 12(b)) is then evaporated onto the metallization lift-off pattern 154 and through the opening 156 to cover the contact window 152, using an e-beam evaporator. The unwanted metallization is removed via a lift-off step that removes the metallization lift-off pattern 154, leaving the p-contact 160 for the device. The p-contact extends beyond the edges of the contact window 152 and seals the contact opening in the SiO₂ layers 122 and 150, as is illustrated. An n-contact 162 for the laser is also evaporated using e-beam evaporation on the back side of the wafer. The n-contact can also be applied to the front side of the wafer using another metallization lift-off step. As previously noted, it will be understood that multiple photonic devices are typically fabricated on the substrate.

Since the etched facets need to be protected (see FIGS. 8(a) and (b)) during the wet etch as discussed above, a remaining feature such as a wall or shoulder 163 is formed on the top surface of the wet etch stop layer, under the mask 136 where the mask extends over the edges 144 and 146. This wall causes a change in the ridge depth at and near the facets so that the ridge depth is shallower at and near the etched facets than at the base of the ridge. The performance and modal behavior of edge-emitting ridge lasers and ridge HCSELs as fabricated through this process was studied, and the remaining feature 163 (see FIG. 5) was found not to cause any adverse impact, while yield was increased to 98-99.8%.

Although the present invention has been illustrated in terms of preferred embodiments, it will be understood that variations and modifications may be made without departing from the true spirit and scope thereof as set out in the following claims.

What is claimed is:

1. A photonic device comprising:
   a substrate;
   at least a first epitaxial semiconductor structure including an active layer and a wet etch stop layer on said substrate, said wet etch stop layer being located above, and close to, said active layer;
   an etched ridge formed in said structure, said ridge having a base at said stop layer;
   at least a first etched facet fabricated in said structure; and
   at least a first electrode on said structure.

2. The device of claim 1, wherein said etch stop layer is GaInAsP.

3. The device of claim 2, wherein said etched ridge is partially dry etched and partially wet etched.

4. The device of claim 1, wherein said substrate is InP.

5. The device of claim 1, wherein said device is a laser selected from the group comprising an edge emitting laser and a surface emitting laser.

6. The device of claim 5, further comprising a second etched facet fabricated in said structure.

7. A photonic device comprising:
   a substrate; and
   at least a first epitaxial semiconductor structure on said substrate, said epitaxial semiconductor structure comprising:
   a lower cladding layer on said substrate;
   an active layer on said lower cladding layer;
   an upper cladding layer on said active layer, said upper cladding layer including a bottom cladding segment on said active layer; a wet etch stop layer on said bottom segment; and, a top cladding segment on said wet etch stop layer;
   an etched ridge formed in said top cladding segment and having a base at said wet etch stop layer;
   at least a first etched facet fabricated in said structure; and
   a contact layer on said upper cladding layer.

8. The device of claim 7, wherein said etch stop layer is GaInAsP.

9. The device of claim 8, wherein said etched ridge is partially dry etched and partially wet etched.

10. The device of claim 7, wherein said substrate is InP.

11. The device of claim 7, wherein said device is a laser selected from the group comprising an edge emitting laser and a surface emitting laser.

12. The device of claim 11, further comprising a second etched facet fabricated in said structure.

13. A photonic device comprising:
    a substrate;
    at least a first epitaxial semiconductor structure including an active layer and a wet etch stop layer on said substrate;
    an etched ridge formed in said structure, said ridge having a base at said stop layer;
    at least a first etched facet fabricated in said structure;
    an etch floor surrounding said ridge at the base of the ridge and extending to said etched facet;
    a wall portion on said etch floor adjacent said etched facet, whereby said ridge is shallower at said etched facet than at said base; and
    at least a first electrode on said structure.

14. The device of claim 13, wherein said etch stop layer is GaInAsP.

15. The device of claim 14, wherein said etched ridge is partially dry etched and partially wet etched.

16. The device of claim 13, wherein said substrate is InP.

17. The device of claim 13, wherein said device is a laser selected from the group comprising an edge emitting laser and a surface emitting laser.

18. The device of claim 17, further comprising a second etched facet fabricated in said structure.

* * * * *